US 10,454,422 B2

(12) United States Patent
Wang et al.

(10) Patent No.: US 10,454,422 B2
(45) Date of Patent: Oct. 22, 2019

(54) DIFFERENTIAL MIXER AND METHOD

(71) Applicant: Renesas Electronics Corporation, Tokyo (JP)

(72) Inventors: Ningyi Wang, Tokyo (JP); Satoru Tomisawa, Tokyo (JP); Noriaki Matsuno, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/116,745

(22) Filed: Aug. 29, 2018

(65) Prior Publication Data
US 2019/0149092 A1    May 16, 2019

(30) Foreign Application Priority Data

Nov. 13, 2017    (JP) .................................. 2017-218233

(51) Int. Cl.
*H04L 25/06*    (2006.01)
*H04L 7/00*     (2006.01)
*H03D 7/14*     (2006.01)

(52) U.S. Cl.
CPC .......... *H03D 7/1441* (2013.01); *H04L 7/0087* (2013.01); *H04L 25/06* (2013.01); *H03D 2200/0043* (2013.01)

(58) Field of Classification Search
CPC ...... H03D 7/14; H03D 7/1425; H03D 7/1441; H03D 2200/0041; H03D 2200/0043; H04L 7/0079; H04L 7/0087; H04L 25/02; H04L 25/26
See application file for complete search history.

(56) References Cited

U.S. PATENT DOCUMENTS

2012/0264391 A1*   10/2012   Basaran ............... H03D 7/1441
                                                 455/341

OTHER PUBLICATIONS

Yao-Hong Liu, et al.,"A 1.9nJ/b 2.4GHz multistandard (Bluetooth Low Energy/Zigbee/IEEE802.15.6) transceiver for personal/body-area networks", 2013 ISSCC, pp. 446-447.

* cited by examiner

*Primary Examiner* — Lincoln D Donovan
*Assistant Examiner* — Diana J. Cheng
(74) *Attorney, Agent, or Firm* — McGinn IP Law Group, PLLC.

(57)   ABSTRACT

A differential mixer and a method which can reduce a leak component of a local oscillation differential signal are provided. A differential mixer includes a mixer core unit to which a high frequency signal and a local oscillation differential signal are inputted and which outputs an intermediate frequency differential signal, a common feedback unit which applies a bias voltage to a signal electrically coupled to the high frequency signal and to which a common voltage is fed back from the intermediate frequency differential signal, and a bias unit that applies a reference voltage to the common feedback unit. The common feedback unit generates the bias voltage based on the reference voltage. The bias unit controls the reference voltage so that a leak component of the local oscillation differential signal is a predetermined value or less at an output end of the intermediate frequency differential signal.

12 Claims, 12 Drawing Sheets

DIFFERENTIAL MIXER AND METHOD

CROSS-REFERENCE TO RELATED APPLICATIONS

The disclosure of Japanese Patent Application No. 2017-218233 filed on Nov. 13, 2017 including the specification, drawings and abstract is incorporated herein by reference in its entirety.

BACKGROUND

The present invention relates to a differential mixer and a method which, for example, can reduce a leak component of a local oscillation differential signal.

In a wireless receiving apparatus, a primary mixer mixes a high frequency signal and a local oscillation differential signal that are inputted and outputs an intermediate frequency differential signal. In the primary mixer, a leak component of a local oscillation signal (local signal) causes saturation of a post-stage circuit and undesired frequency mixing, so that the leak component is a problem causing deterioration of characteristics of the receiving apparatus.

A BLE (Bluetooth (registered trademark) Low Energy) transceiver having a low noise amplifier and a primary mixer is described in Yao-Hong Liu, et al., "A 1.9 nJ/b 2.4 GHz multistandard (Bluetooth Low Energy/Zigbee/IEEE802.15.6) transceiver for personal/body-area networks", 2013 ISSCC, Pages: 446-447 (Non Patent Literature 1). Non Patent Literature 1 describes that the primary mixer is a complementary push-pull mixer which performs single end-differential conversion (differential conversion) at the same time as frequency conversion. However, Non Patent Literature 1 does not describe that the leak component of the local oscillation signal is reduced.

SUMMARY

As described above, in the wireless receiving apparatus, the primary mixer convers a wireless high frequency signal into an intermediate frequency signal. However, there is a problem that the leak component of the local oscillation differential signal of the primary mixer causes saturation of a post-stage circuit, undesired frequency mixing, and the like, which cause deterioration of characteristics of the receiving apparatus.

The other problems and novel features will become apparent from the description of the present specification and the accompanying drawings.

According to an embodiment, a differential mixer includes a mixer core unit to which a high frequency signal and a local oscillation differential signal are inputted and which outputs an intermediate frequency differential signal, a common feedback unit which applies a bias voltage to a signal electrically coupled to the high frequency signal and to which a common voltage is fed back from the intermediate frequency differential signal, and a bias unit that applies a reference voltage to the common feedback unit. The common feedback unit generates the bias voltage based on the reference voltage. The bias unit controls the reference voltage so that a leak component of the local oscillation differential signal is a predetermined value or less at an output end of the intermediate frequency differential signal.

According to the embodiment, it is possible to provide a differential mixer and a method which can reduce the leak component of the local oscillation differential signal.

DETAILED DESCRIPTION

Figure 1A:
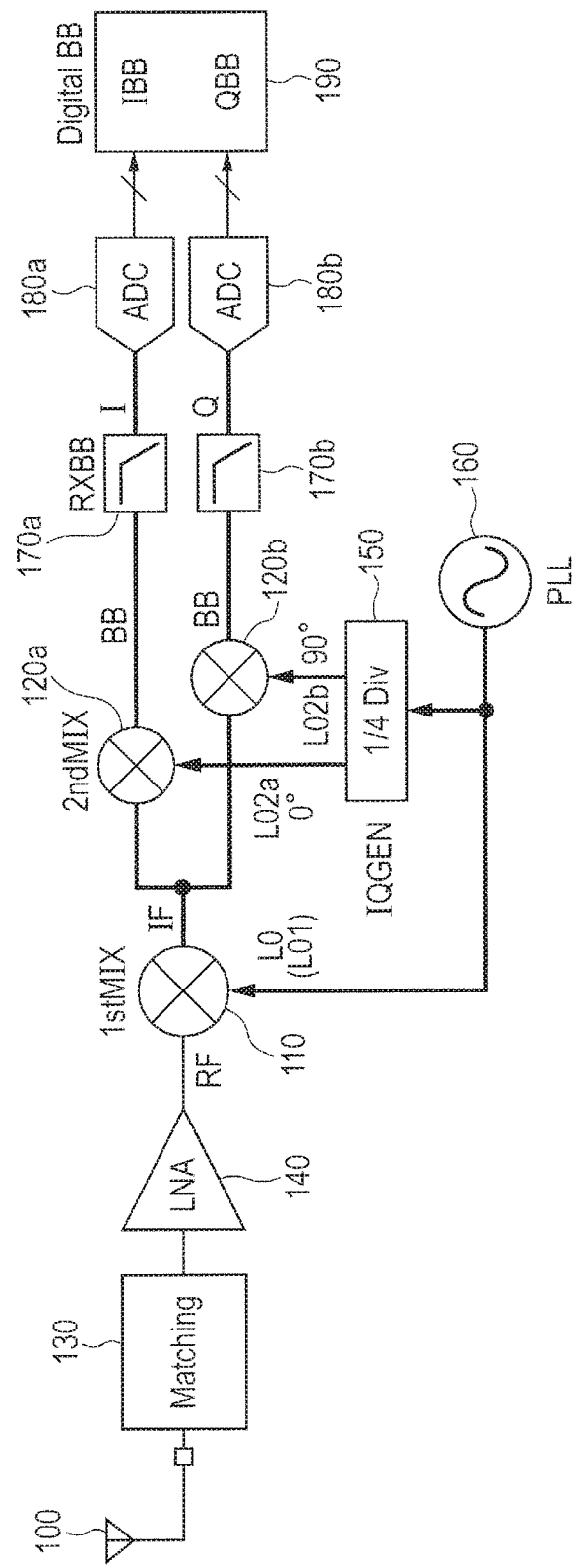
FIG. 1A is a block diagram illustrating a receiving apparatus according to a first embodiment.

For clarity of explanation, the following description and drawings are appropriately omitted and simplified. The components shown in the drawings as functional blocks that perform various processing can be formed by a CPU, a memory, and other circuits as hardware and are realized by a program and the like loaded in a memory as software. Therefore, it should be understood by those skilled in the art that the functional blocks can be realized in various forms by only hardware, only software, or a combination of these, and the functional blocks are not limited to any one of hardware, software, and a combination of these. In the drawings, the same components are denoted by the same reference symbols and redundant description is omitted as appropriate.

The program described above can be stored in various types of non-transitory computer readable media and supplied to a computer. The non-transitory computer readable media include various types of substantial recording media. Examples of the non-transitory computer readable media include a magnetic recording medium (for example, flexible disk, magnetic tape, and hard disk drive), a magneto-optical recording medium (for example, magneto-optical disk), a CD-ROM (Read Only Memory), a CD-R, a CD-R/W, a semiconductor memory (for example, mask ROM, PROM (Programmable ROM), EPROM (Erasable PROM), flash ROM, and RAM (Random Access Memory)). The program may be supplied to a computer by various types of transitory computer readable media. Examples of the transitory computer readable media include an electrical signal, an optical signal, and an electromagnetic wave. The transitory computer readable media can supply the program to a computer through a wired communication path such as an electrical wire and an optical fiber or a wireless communication path.

First Embodiment

First, an operation of a receiving apparatus will be described.

FIG. 1A is a block diagram illustrating a receiving apparatus according to a first embodiment.

As shown in FIG. 1A, the receiving apparatus 10 s according to the first embodiment has a sliding IF configuration. In the receiving apparatus 10, a RF (Radio Frequency) unit is single-ended in order to reduce power consumption of a receiving circuit. Specifically, an LNA (Low Noise Amplifier) 140 is formed into a single-ended configuration, a 1st MIX (Mixer) 110 is formed into a complementary type differential mixer having a push-pull configuration, and a differential conversion is performed from single end at the same time as frequency conversion.

In the receiving apparatus 10, a high frequency signal RF inputted from an antenna 100 is inputted into the LNA 140 through a Matching 130. The high frequency signal RF amplified by the LNA 140 is inputted into the 1st MIX 110.

The high frequency signal RF (Radio Frequency) and a local oscillation differential signal LO(Local)1 are inputted into the 1st MIX 110, and the 1st MIX 110 outputs an intermediate frequency differential signal IF (IntermediYate Frequency).

The PLL (Phase Locked Loop) 160 outputs the local oscillation differential signal LO1. The local oscillation differential signal LO1 is inputted into the 1st MIX 110 and a ¼ Div (¼ Divider) 150.

The ¼ Div 150 reduces the frequency of the local oscillation differential signal LO1 to a quarter and outputs the signal as a local oscillation differential signal LO2a. The local oscillation differential signal LO2a is outputted to a 2nd MIX 120a. Further, the ¼ Div 150 outputs a local oscillation differential signal LO2b whose phase is shifted by 90 degrees from the local oscillation differential signal LO2a. The local oscillation differential signal LO2b is inputted into a 2nd MIX 120b.

The intermediate frequency differential signal IF and the local oscillation differential signal LO2a are inputted into the 2nd MIX 120a. The 2nd MIX 120a outputs a baseband signal BB (Base Band)I for I channel. The intermediate frequency differential signal IF and the local oscillation differential signal LO2b are inputted into the 2nd MIX 120b. The 2nd MIX 120b outputs a baseband signal BBQ for Q channel.

The baseband signal BBI is filter-processed by RXBB 170a and converted from an analog signal to a digital signal by ADC 180a. The baseband signal BBQ is also processed in a similar way, and a signal converted from an analog signal to a digital signal is reproduced to an original signal by Digital BB 190.

Next, an operation frequency of the receiving apparatus according to the first embodiment will be described.

Figure 1B:
FIG. 1B is a block diagram illustrating operating frequencies of the receiving apparatus according to the first embodiment.

FIG. 1B is a block diagram illustrating operating frequencies of the receiving apparatus according to the first embodiment.

Figure 1C:
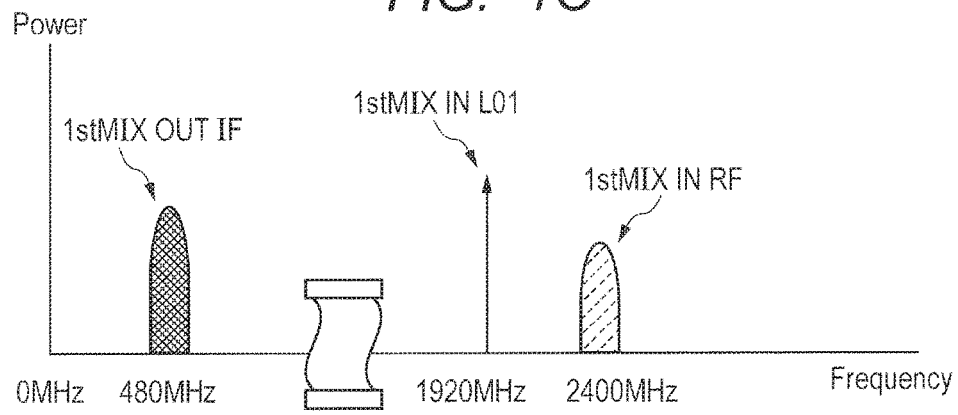
FIG. 1C is a graph illustrating electric power of the operating frequencies of the receiving apparatus according to the first embodiment.

FIG. 1C is a graph illustrating electric power of the operating frequencies of the receiving apparatus according to the first embodiment.

FIG. 1C shows frequencies of input and output signals of the 1st MIX 110.

The horizontal axis of FIG. 1C represents frequency (Frequency) and the vertical axis represents electric power (Power).

Figure 1D:
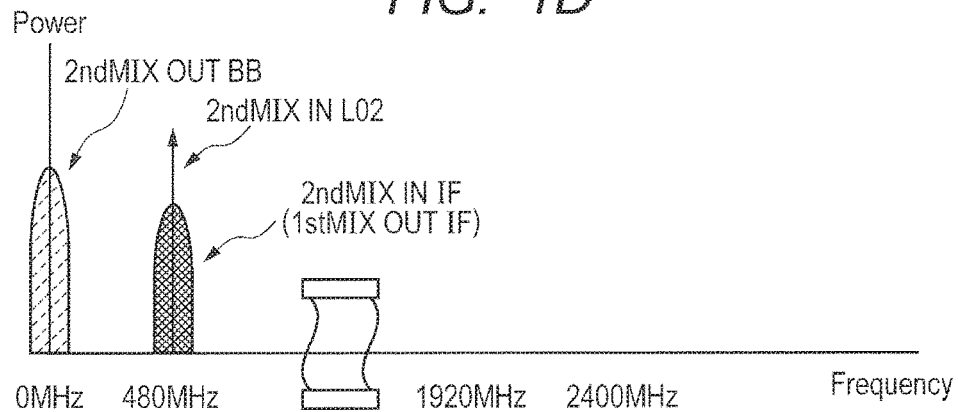
FIG. 1D is a graph illustrating electric power of the operating frequencies of the receiving apparatus according to the first embodiment.

FIG. 1D is a graph diagram illustrating electric power of the operating frequencies of the receiving apparatus according to the first embodiment.

FIG. 1D shows frequencies of input and output signals of the 2nd MIX 120. For ease of explanation, the 2nd MIX 120a and the 2nd MIX 120b are collectively referred to as a 2nd MIX 120, the local oscillation differential signal LO2a and the local oscillation differential signal LO2b are collectively referred to as a local oscillation differential signal LO2, and the baseband signal BBI and the baseband signal BBQ are collectively referred to as a baseband signal BB.

The horizontal axis of FIG. 1D represents frequency (Frequency) and the vertical axis represents electric power (Power).

As shown in FIGS. 1B and 1C, for example, a signal of frequency 2400 MHz (megahertz) as the high frequency signal RF and a signal of frequency 1920 MHz (megahertz) as the local oscillation differential signal LO1 are inputted into the 1st MIX 110. In this case, the 1st MIX 110 outputs a signal of frequency 480 MHz (megahertz), which is a differential frequency between the high frequency signal RF and the local oscillation differential signal LO1, as the intermediate frequency differential signal IF. At this time, in the first embodiment, a leak component LO1k of the local oscillation differential signal LO1 is sufficiently reduced.

As shown in FIGS. 1B and 1D, for example, a signal of frequency 480 MHz (megahertz) as the intermediate frequency differential signal IF and a signal of frequency 480 MHz (megahertz) as the local oscillation differential signal LO2 are inputted into the 2nd MIX 120. In this case, the 2nd MIX 120 outputs a signal of frequency 0 MHz (megahertz), which is a differential frequency between the intermediate frequency differential signal IF and the local oscillation differential signal LO2, as the baseband signal BB. At this time, in the first embodiment, the leak component LO1k of the local oscillation differential signal LO1 is not inputted into the 2nd MIX. Thereby, saturation of a post-stage circuit and undesired frequency mixing are less generated.

The 2400 MHz of the high frequency signal RF and the 1920 MHz of the local oscillation differential signal LO1 are examples, and these signals may have different frequencies, respectively.

Next, an operation of the 1st MIX will be described.

The 1st MIX is a mixer that operates by differentiation, so that the 1st MIX may be referred to as a differential mixer.

Figure 2:
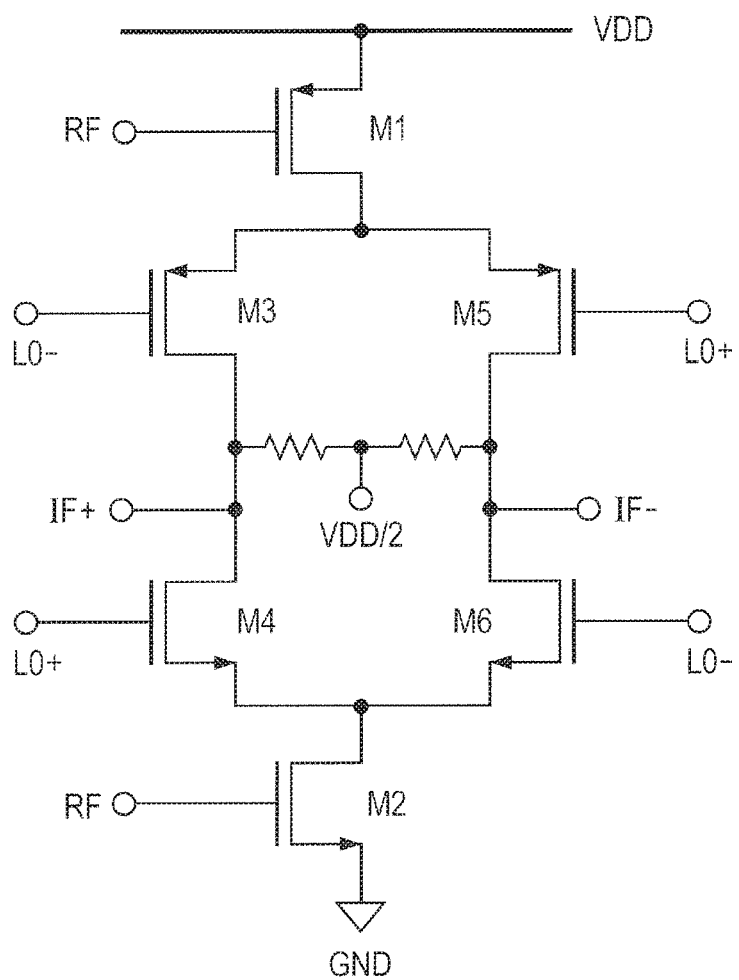
FIG. 2 is a circuit diagram illustrating a differential mixer.

FIG. 2 is a circuit diagram illustrating a differential mixer.

For ease of explanation, the local oscillation differential signal LO1 is described as a local oscillation differential signal LO.

As shown in FIG. 2, the high frequency signal RF is inputted into a gate G of a first element M1 of a PMOS (P-type metal-oxide-semiconductor) of a differential mixer 210 and a gate G of a second element M2 of an NMOS (N-type metal-oxide-semiconductor) of the differential mixer 210. A plus side signal LO+ of a local oscillation differential signal is inputted into a gate G of a fifth element M5 of the PMOS of the differential mixer 210 and a gate G of a fourth element M4 of the NMOS of the differential mixer 210. A minus side signal LO− of the local oscillation differential signal is inputted into a gate G of a third element M3 of the PMOS of the differential mixer 210 and a gate G of a sixth element M6 of the NMOS of the differential mixer 210.

A cascode coupling branch between the first element M1 and the third element M3 of the PMOS and a cascode coupling branch between the second element M2 and the fourth element M4 of the NMOS operate at a certain moment due to polarity (LO+ and LO−) of the local oscillation differential signal LO. Then, outputs from the two branches are added together, and an added signal is outputted to a plus side signal IF+ of the intermediate frequency differential signal.

At another moment, a cascode coupling branch between the first element M1 and the fifth element M5 of the PMOS and a cascode coupling branch between the second element M2 and the sixth element M6 of the NMOS operate and a signal is outputted to a minus side signal IF− of the intermediate frequency differential signal.

By alternately repeating these two states, the differential mixer 210 can obtain an output. When the characteristics of the cascode coupling branches of PMOS and NMOS are matched with each other, a leak component LOk of the local oscillation differential signal LO generated in each state is cancelled.

However, when the characteristics of PMOS and NMOS of the push-pull type differential mixer 210 are not balanced (when there is a variation of characteristics), the leak component LOk of the local oscillation differential signal LO begins to leak to the plus side signal IF+ of the intermediate frequency differential signal and the minus side signal IF− of the intermediate frequency differential signal which are outputs of the differential mixer 210. This is referred to as a local leak.

The plus side signal IF+ of the intermediate frequency differential signal and the minus side signal IF− of the intermediate frequency differential signal may be collectively referred to as an intermediate frequency differential signal IF.

When the local leak occurs in this way, the local leak causes saturation of a post-stage circuit and undesired frequency mixing, which cause a problem such as deterioration of characteristics of the receiving apparatus.

Next, the deterioration of characteristics of the receiving apparatus due to occurrence of the local leak will be described.

Figure 3A:
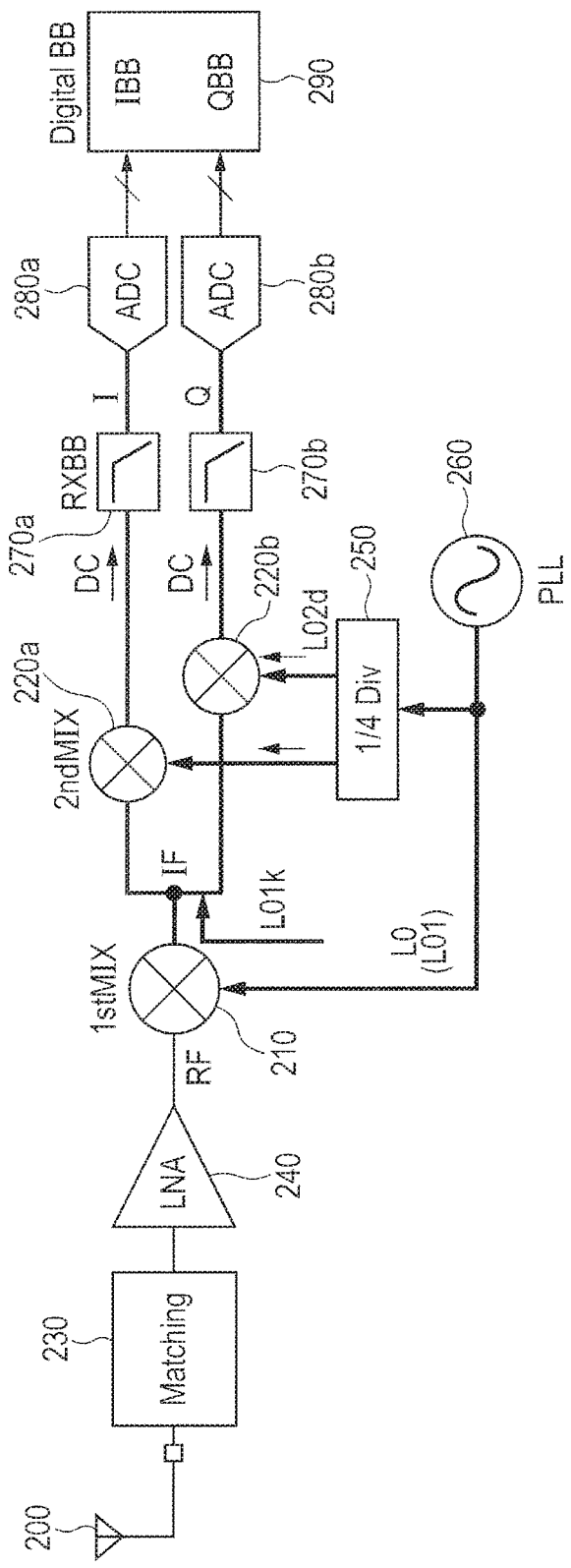
FIG. 3A is a block diagram illustrating a receiving apparatus.

FIG. 3A is a block diagram illustrating the receiving apparatus.

Figure 3B:
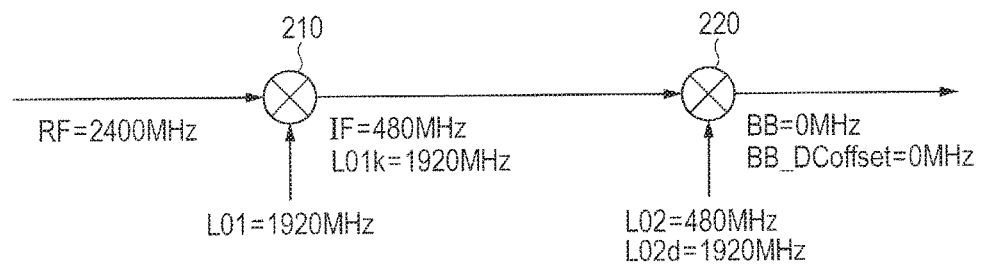
FIG. 3B is a block diagram illustrating operating frequencies of the receiving apparatus.

FIG. 3B is a block diagram illustrating operating frequencies of the receiving apparatus.

Figure 3C:
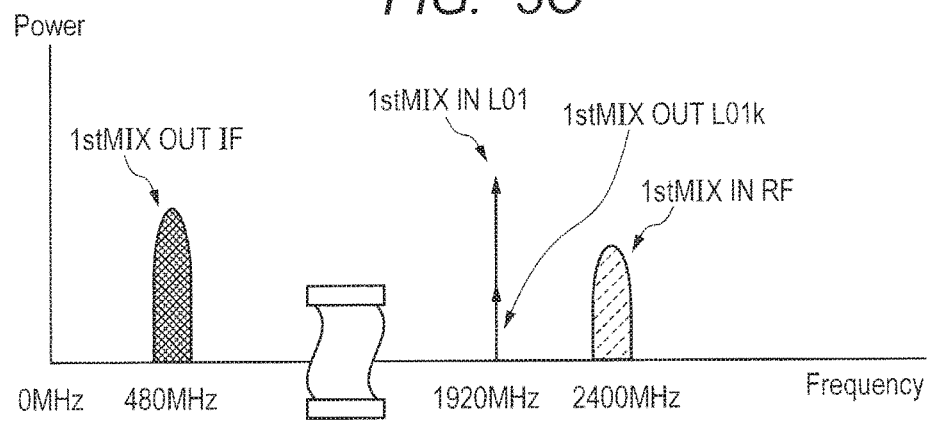
FIG. 3C is a graph illustrating electric power of the operating frequencies of the receiving apparatus.

FIG. 3C is a graph illustrating electric power of the operating frequencies of the receiving apparatus.

FIG. 3C shows frequencies of input and output signals of a 1st MIX 210.

The horizontal axis of FIG. 3C represents frequency (Frequency) and the vertical axis represents electric power (Power).

Figure 3D:
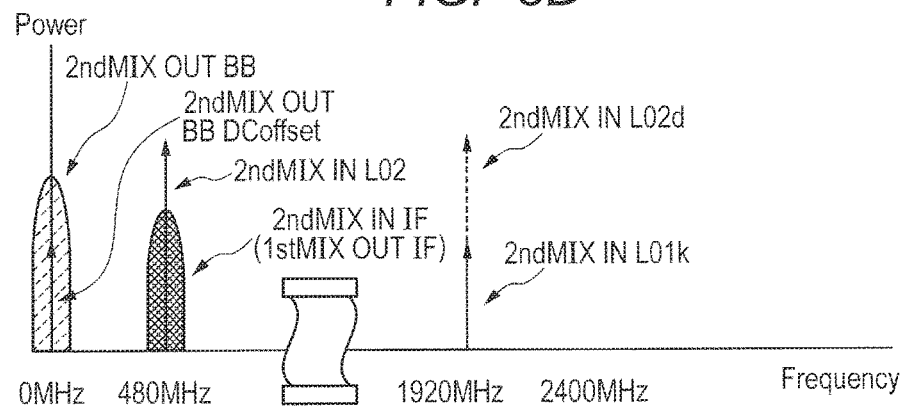
FIG. 3D is a graph illustrating electric power of the operating frequencies of the receiving apparatus.

FIG. 3D is a graph illustrating electric power of the operating frequencies of the receiving apparatus.

FIG. 3D shows frequencies of input and output signals of a 2nd MIX 220. For ease of explanation, a 2nd MIX 220a and a 2nd MIX 220b are collectively referred to as a 2nd MIX 220, and the local oscillation differential signal LO2a and the local oscillation differential signal LO2b are collectively referred to as a local oscillation differential signal LO2.

The horizontal axis of FIG. 3D represents frequency (Frequency) and the vertical axis represents electric power (Power).

As shown in FIGS. 3A to 3D, when the leak component LO1k (shown as 1st MIX OUT LO1k in FIG. 3C) of the local oscillation differential signal LO1 occurs in the 1st MIX 210, the leak component LO1k is inputted into the 2nd MIX 220. The frequency of the leak component LO1k is, for example, 1920 MHz. The frequency of the local oscillation differential signal LO2 of the 2nd MIX 220 is, for example, 480 MHz, and a local oscillation fourth harmonic wave signal LO2d, which is a fourth harmonic wave of the local oscillation differential signal LO2, is inputted into the 2nd MIX 220. The frequency of the local oscillation fourth harmonic wave signal LO2d is 1920 MHz because it is four times the frequency of the local oscillation differential signal LO2.

Thereby, in the 2nd MIX 220, the leak component LO1k and the local oscillation fourth harmonic wave signal LO2d, which have the same frequency (1920 MHz), are mixed, and BB_DC offset which is a DC component is outputted. The BB_DC offset which is a DC component is amplified by RXBB270 and adversely affects the baseband signal BB which is also a DC component. For example, the BB_DC offset causes various problems such as degradation of reception sensitivity and malfunction of AGC (Automatic Gain Control).

The amount of the leak component LO1k of the local oscillation differential signal LO1 is largely affected by variation of characteristics of a process of an element (semiconductor element) that configures the 1st MIX 210.

In the 1st MIX 210, for example, when a circuit constant is determined so that the leak component LO1k is reduced by a tt condition where the characteristics of the NMOS and the PMOS are shifted in the same direction, characteristics changes of the NMOS and the PMOS have the same polarity (Both are slow or Both are fast) in an ss condition and an ff condition, so that the leak component LO1k can be reduced by performing a proper design.

On the other hand, in the 1st MIX 210, when a circuit constant is determined so that the leak component LO1k is reduced by an fs condition or an sf condition where the characteristics of the NMOS and the PMOS are shifted in the opposite directions, a balance between the NMOS and the PMOS collapses, so that it is difficult to reduce the leak component LO1k and some kind of countermeasure is required.

In manufacturing variation of semiconductor element characteristics, for example, a variation where a threshold voltage is low and a current more than a designed value flows is referred to as fast, for example, a variation where a threshold voltage is high and a current less than the designed value flows is referred to as slow, and a variation where a current near the designed value flows is referred to as typical. A factor to be a manufacturing variation is different between NMOS and PMOS, and there may be a plurality of conditions by a combination. A case where both NMOS and PMOS elements are typical is referred to as a tt condition, a case where both NMOS and PMOS elements are slow is referred to as an ss condition, and a case where both NMOS and PMOS elements are fast is referred to as an ff condition. A case where the NMOS element is slow and the PMOS element is fast is referred to as an sf condition. A case where the NMOS element is fast and the PMOS element is slow is referred to as an fs condition.

Next, a variation of characteristics of a process of an element that configures a differential mixer (1st MIX) and the amount of the leak component LO1k will be described.

Figure 4A:
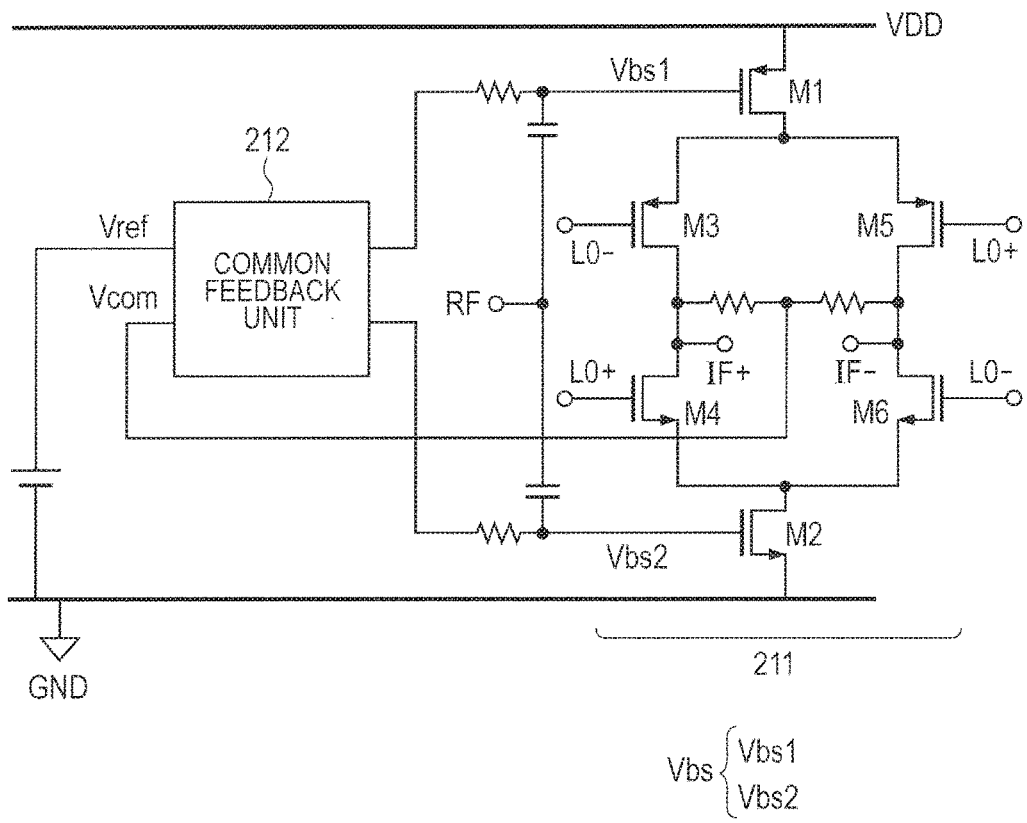
FIG. 4A is a circuit diagram illustrating a differential mixer.

FIG. 4A is a circuit diagram illustrating the differential mixer.

As illustrated in FIG. 4A, the differential mixer 210 is, for example, a push-pull type differential mixer as shown in FIG. 2 and has a plurality of NMOS elements and a plurality of PMOS elements.

The differential mixer 210 includes a mixer core unit 211 and a common feedback unit 212. A reference voltage Vref which is a fixed voltage is applied to the common feedback unit 212. A common voltage Vcom based on the reference voltage Vref is fed back from the mixer core unit 211 to the common feedback unit 212.

The differential mixer 210 gives a first bias voltage Vbs1 and a second bias voltage Vbs2 that are applied to the gates G of the first element M1 and the second element M2, respectively, as a current mirror that is operated by a common reference current. The plus side signal LO+ of the local oscillation differential signal is inputted from the gate G of the fourth element M4 of the NMOS and the gate G of the fifth element M5 of the PMOS. At this time, the leak component LO1k is also inputted. Here, when a phase difference between a leak component LO1kn on the NMOS side inputted from the gate G of the fourth element M4 of the NMOS and a leak component LO1kp on the PMOS side inputted from the gate G of the fifth element M5 of the PMOS is 180 degrees, the leak component LO1k is completely cancelled, so that it is possible to reduce the amount of the leak component LO1k. The same goes for the minus side signal LO− of the local oscillation differential signal.

However, the phase difference between the leak component LO1kn on the NMOS side and the leak component LO1kp on the PMOS side varies depending on a combination of characteristics variations of the NMOS and the PMOS. Therefore, it is necessary to reduce the leak component LO1k without depending on the combination of characteristics variations of the NMOS and the PMOS.

The reference voltage may be referred to as a standard voltage.

Next, a relationship between the common voltage of the differential mixer and the amount of leak component will be described.

Figure 4B:
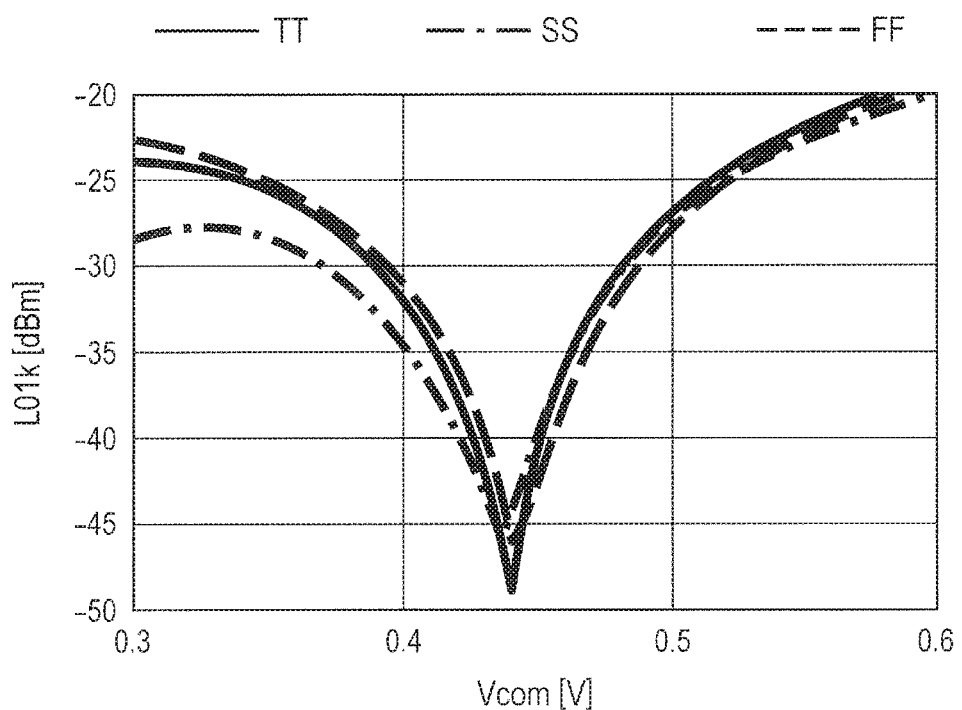
FIG. 4B is a graph illustrating a relationship between a common voltage of the differential mixer and the amount of leak component.

FIG. 4B is a graph illustrating a relationship between the common voltage of the differential mixer and the amount of leak component.

FIG. 4B shows a case of tt condition, ss condition, and ff condition.

The horizontal axis of FIG. 4B represents the common voltage Vcom and the vertical axis represents the amount of the leak component LO1k.

Figure 4C:
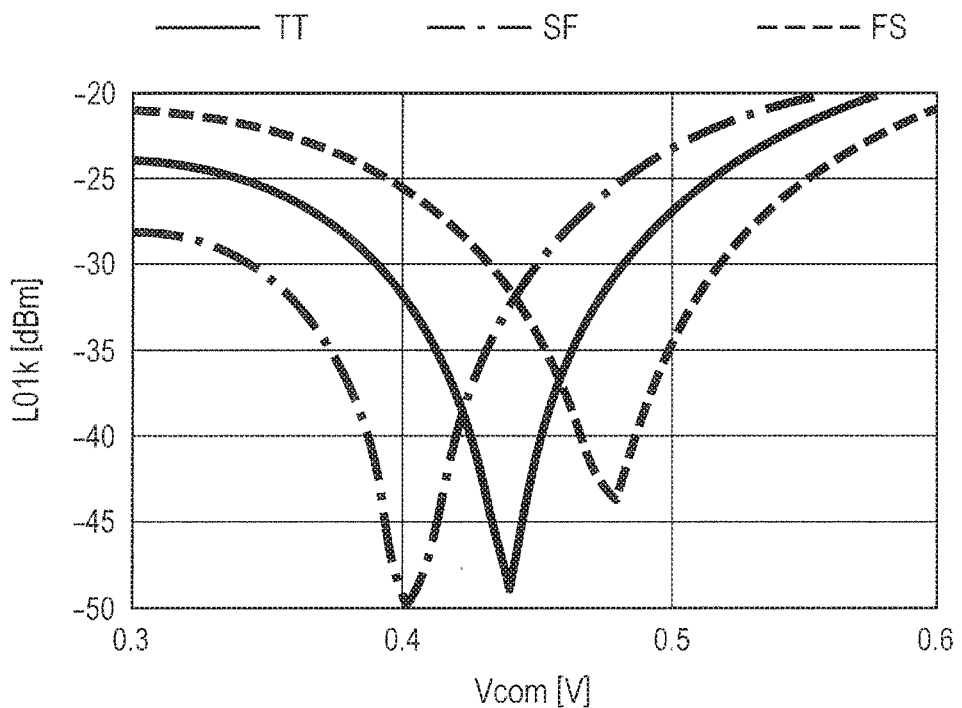
FIG. 4C is a graph illustrating a relationship between a common voltage of the differential mixer and the amount of leak component.

FIG. 4C is a graph illustrating a relationship between the common voltage of the differential mixer and the amount of leak component.

FIG. 4C shows a case of tt condition, sf condition, and fs condition.

The horizontal axis of FIG. 4C represents the common voltage Vcom and the vertical axis represents the amount of the leak component LO1k.

As shown in FIG. 4B, in the case of tt condition, ss condition, and ff condition, it is possible to minimize the amount of the leak component LO1k by using substantially the same common voltage Vcom.

On the other hand, as shown in FIG. 4C, in the case of tt condition, sf condition, and fs condition, it is difficult to minimize the amount of the leak component LO1k by using the same common voltage Vcom. In other words, the common voltage Vcom at which the amount of the leak component LO1k is minimized varies depending on each condition.

The reason why the amount of the leak component LO1k varies according to the common voltage Vcom is because the phase difference between the NMOS side and the PMOS side varies. When the phase difference between the NMOS side and the PMOS side is 180 degrees, the amount of the leak component LO1k is minimized. The common voltage Vcom that gives a point at which the amount of the leak component LO1k is minimized is varied by variation of characteristics of processes of the NMOS and the PMOS. In the case of tt condition, ss condition, and ff condition, the common voltage Vcom that gives the minimum point is substantially the same. On the other hand, in the case of fs condition, the common voltage Vcom that gives the minimum point is shifted higher than the common voltage Vcom that gives the minimum point of the tt condition. In the case of sf condition, the common voltage Vcom that gives the minimum point is shifted lower than the common voltage Vcom that gives the minimum point of the tt condition. Therefore, when an optimal common voltage Vcom can be set in each of tt condition, sf condition, and fs condition, the leak component LO1k can be reduced.

Therefore, in the differential mixer 110 according to the first embodiment, the common voltage Vcom is set so that the amount of the leak component LOk is minimized in each condition. In other words, a variation dependency of characteristics of a process is corrected by reflecting the characteristics variations of the NMOS and the PMOS on the common voltage Vcom.

Next, the differential mixer according to the first embodiment will be described.

In the differential mixer 110 according to the first embodiment, the common voltage Vcom is set so that the amount of the leak component LOk is reduced in each condition.

Figure 5A:
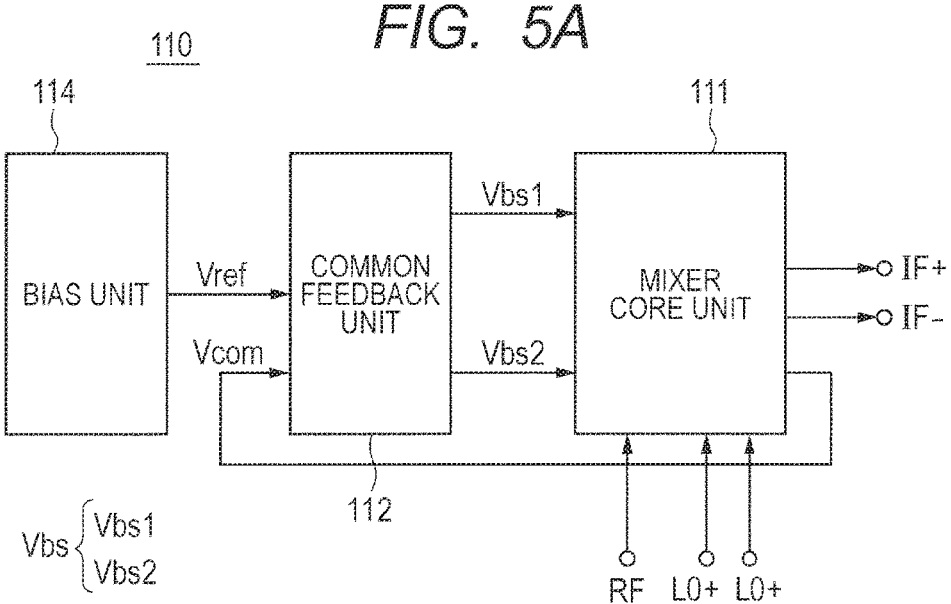
FIG. 5A is a block diagram illustrating a differential mixer according to the first embodiment.

FIG. 5A is a block diagram illustrating the differential mixer according to the first embodiment.

As shown in FIG. 5A, the differential mixer 110 according to the first embodiment includes a mixer core unit 111, a common feedback unit 112, and a bias unit 114.

The high frequency signal RF and the local oscillation differential signal LO are inputted into the mixer core unit 111, and the mixer core unit 111 outputs the intermediate frequency differential signal IF.

The common feedback unit 112 applies a bias voltage Vbs to a signal electrically coupled to the high frequency signal RF, and the common voltage Vcom is fed back from the intermediate frequency differential signal IF to the common feedback unit 112. The bias voltage Vbs includes a first bias voltage Vbs1 and a second bias voltage Vbs2.

The bias unit 114 applies a reference voltage Vref to the common feedback unit 112. The common feedback unit 112 generates the bias voltage Vbs based on the reference voltage Vref. The bias unit 114 controls the reference voltage Vref so that the leak component LOk of the local oscillation differential signal LO is a predetermined value Pth or less at an output end (not shown in the drawings) of the intermediate frequency differential signal IF.

The common voltage Vcom is outputted from the mixer core unit 111 based on the reference voltage Vref. Therefore, the bias unit 114 may generate the reference voltage Vref so as to obtain the common voltage Vcom at which the leak component LOk of the local oscillation differential signal LO is a predetermined value Pth or less at the output end of the intermediate frequency differential signal IF.

The bias unit may be referred to as a bias circuit, the common feedback unit may be referred to as a common feedback circuit, and the mixer core unit may be referred to as a mixer core circuit.

Figure 5B:
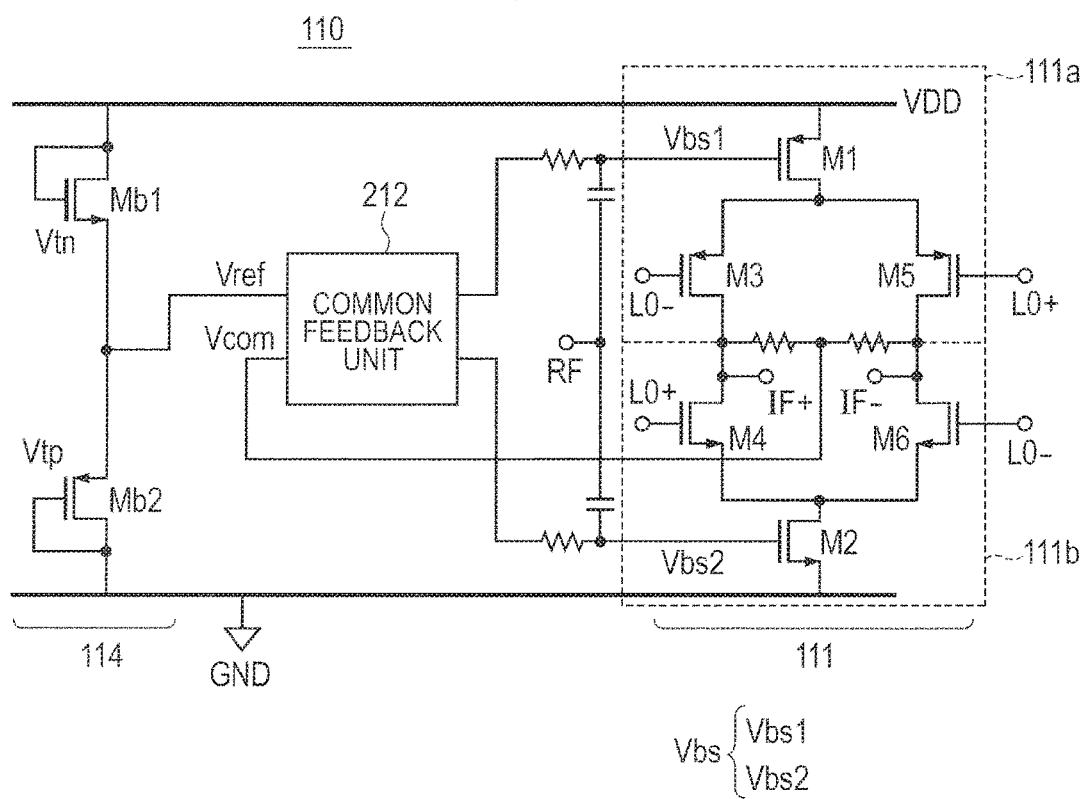
FIG. 5B is a circuit diagram illustrating the differential mixer according to the first embodiment.

FIG. 5B is a circuit diagram illustrating the differential mixer according to the first embodiment.

As shown in FIG. 5B, the bias unit 114 has a first bias element Mb1 and a second bias element Mb2. The first bias element Mb1 is a second type semiconductor element where the drain D and the gate G are electrically coupled to a DC voltage VDD. The second bias element Mb2 is a first type semiconductor element where a drain D and a gate G are electrically coupled to a ground GND and a source S is coupled to a source S of the first bias element Mb1. The bias unit 114 outputs a voltage of a source S of the first bias element Mb1 to the common feedback unit 112 as the reference voltage Vref.

In other words, the bias unit 114 generates the reference voltage Vref, and the reference voltage Vref is inputted into the common feedback unit 112. The common feedback unit 112 generates the bias voltage Vbs based on the reference voltage Vref.

The reference voltage Vref outputted from the bias unit 114 can be represented by the following Expression 1.

[Expression 1]

$$Vref = \frac{VDD - Vtp - Vtn}{2} \quad (1)$$

Here, VDD is the DC voltage shown in FIG. 5B, Vtn is a threshold voltage between the gate G and the source S of the first bias element Mb1 shown in FIG. 5B, and Vtp is a threshold voltage between the gate G and the source S of the second bias element Mb2 shown in FIG. 5B.

According to the Expression 1 described above, in the case of fs condition, the reference voltage Vref rises by the amount of variation of the threshold voltages. For example, a case is considered where the first bias element Mb1 which is NMOS is fast, and the second bias element Mb2 which is PMOS is slow. In this case, it is assumed that a threshold voltage Vtn of the first bias element Mb1 is low, for example, 0.3V (volt), and a threshold voltage Vtp of the second bias element Mb2 is high, for example, 0.5V (volt). It is assumed that a threshold voltage of a designed value (typical) is, for example, 0.4 V (volt). The sign of the threshold voltage Vtp is minus, so that the numerator of the Expression 1 is (VDD−(−0.5)−0.3). That is, the numerator of the Expression 1 is (VDD+0.2). In the case of fs condition, the reference voltage Vref is higher than that in the case of tt condition. In the case of sf condition, the reference voltage Vref falls by the amount of variation of the threshold voltages. For example, a case is considered where the first bias element Mb1 which is NMOS is slow, and the second bias element Mb2 which is PMOS is fast. In this case, it is assumed that the threshold voltage Vtn of the first bias element Mb1 is high, for example, 0.5 V (volt), and the threshold voltage Vtp of the second bias element Mb2 is low, for example, 0.3 V (volt). It is assumed that the threshold voltage of the designed value (typical) is, for example, 0.4 V (volt). The sign of the threshold voltage Vtp is minus, so that the numerator of the Expression 1 is (VDD−(−0.3)−0.5). That is, the numerator of the Expression 1 is (VDD−0.2). In the case of sf condition, the reference voltage Vref is lower than that in the case of tt condition. In the case of tt condition, ss condition, and ff condition, the reference voltage does not vary.

The bias unit 114 generates the reference voltage Vref according to the Expression 1. As obvious from the circuit diagram of the differential mixer 110 shown in FIG. 5B, when the reference voltage Vref rises, the common voltage Vcom also rises, and when the reference voltage Vref falls, the common voltage Vcom also falls. Therefore, in the case of tt condition, ss condition, and ff condition, the bias unit 114 generates an almost constant reference voltage Vref. The common feedback unit 112 generates the bias voltage Vbs based on the reference voltage Vref, and the mixer core unit 111 outputs (generates) the common voltage Vcom based on the bias voltage Vb, so that the common voltage Vcom in the case of tt condition, ss condition, and ff condition is almost constant. In the case of fs condition, the bias unit 114 generates the reference voltage Vref higher than that in the case of tt condition. The common feedback unit 112 generates the bias voltage Vbs based on the reference voltage Vref, and the mixer core unit 111 outputs (generates) the common voltage Vcom based on the bias voltage Vb, so that in the case of fs condition, the common voltage Vcom higher than that in the case of tt condition is generated. In the case of sf condition, the bias unit 114 generates the reference voltage Vref lower than that in the case of tt condition. The common feedback unit 112 generates the bias voltage Vbs based on the reference voltage Vref, and the mixer core unit 111 outputs (generates) the common voltage Vcom based on the bias voltage Vb, so that in the case of sf condition, the common voltage Vcom lower than that in the case of tt condition is generated.

In this way, in the case of fs condition, the differential mixer 110 according to the first embodiment generates the common voltage Vcom higher than that in the case of tt condition, and in the case of sf condition, the differential mixer 110 generates the common voltage Vcom lower than that in the case of tt condition. Thereby, in the case of fs condition, the common voltage Vcom higher than that in the case of tt condition is generated, so that the leak component LO1k is reduced as shown in FIG. 4C. Further, in the case of sf condition, the differential mixer 110 generates the common voltage Vcom lower than that in the case of tt condition, so that the leak component LO1k is reduced as shown in FIG. 4C. As a result, in the first embodiment, the leak component LO1k can be reduced without depending on the combination of characteristics variations of the NMOS and the PMOS.

As shown in FIG. 5B, the mixer core unit 111 has a first mixer core 111a that is a single balanced mixer formed by the first type semiconductor element and a second mixer core 111b that is a single balanced mixer formed by the second type semiconductor element.

The plus side signal IF+ of the intermediate frequency differential signal of the first mixer core 111a and the plus side signal IF+ of the intermediate frequency differential signal of the second mixer core 111b are electrically coupled. The minus side signal IF− of the intermediate frequency differential signal of the first mixer core 111a and the minus side signal IF− of the intermediate frequency differential signal of the second mixer core 111b are electrically coupled.

The details are as follows.

The first mixer core 111a has a first element M1, a third element M3, and a fifth element M5. The first element M1 is the first type semiconductor element whose source S is coupled to the DC voltage VDD. The third element M3 is the first type semiconductor element whose source S is coupled to the drain D of the first element M1. The fifth element M5 is the first type semiconductor element whose source S is coupled to the drain D of the first element M1.

The second mixer core 111b has a second element M2, a fourth element M4, and a sixth element M6. The second element M2 is the second type semiconductor element whose source S is coupled to the ground GND. The fourth element M4 is the second type semiconductor element whose source S is coupled to the drain D of the second element M2 and whose drain D is coupled to the drain D of the third element M3. The sixth element M6 is the second type semiconductor element whose source S is coupled to the drain D of the second element M2 and whose drain D is coupled to the drain D of the fifth element M5.

The bias voltage Vbs has a first bias voltage Vbs1 and a second bias voltage Vbs2. The first bias voltage Vbs1 is applied to the gate G of the first element M1. The second bias voltage Vbs2 is applied to the gate G of the second element M2. The common voltage Vcom is outputted from the drain D of the third element M3.

The high frequency signal RF is inputted into the gate G of the first element M1 and the gate G of the second element M2. The plus side signal LO+ of the local oscillation differential signal is inputted into the gate G of the fourth element M4 and the gate G of the fifth element M5. The minus side signal LO− of the local oscillation differential signal is inputted into the gate G of the third element M3 and the gate G of the sixth element M6.

The plus side signal IF+ of the intermediate frequency differential signal is outputted from the drain D of the third element M3. The minus side signal IF− of the intermediate frequency differential signal is outputted from the drain D of the fifth element M5.

Each of the first type semiconductor element and the second type semiconductor element is, for example, a field effect transistor. In the first type semiconductor element, majority carriers are holes, and in the second type semiconductor element, majority carriers are electrons. Specifically, the first type semiconductor element is, for example, NMOS, and the second type semiconductor element is PMOS.

The differential mixer 110 according to the first embodiment controls the reference voltage Vref so that the leak component LOk of the local oscillation differential signal LO is the predetermined value Pth or less at the output end of the intermediate frequency differential signal IF. Specifically, in the case of fs condition, the differential mixer 110 generates the reference voltage Vref higher than that in the case of tt condition, and in the case of sf condition, the differential mixer 110 generates the reference voltage Vref lower than that in the case of tt condition. When the reference voltage Vref rises, the common voltage Vcom also rises, and when the reference voltage Vref falls, the common voltage Vcom also falls. In the case of fs condition, the common voltage Vcom is higher than that in the case of tt condition, so that the leak component LO1k is reduced as shown in FIG. 4C. In the case of sf condition, the common voltage Vcom is lower than that in the case of tt condition, so that the leak component LO1k is reduced as shown in FIG. 4C. In this way, the amount of the leak component LOk can be prevented from depending on the combination of manufacturing variations of the NMOS and the PMOS. In the case of fs condition and sf condition, it is possible to reduce the amount of the leak component LOk of the local oscillation differential signal LO by automatically adjusting the reference voltage Vref according to the characteristics of each process.

As a result, it is possible to provide a differential mixer and a method which can reduce the leak component of the local oscillation differential signal.

While the differential mixer has been described in the first embodiment, the first embodiment can be applied to a wireless receiving apparatus having the differential mixer according to the first embodiment.

The first embodiment can also be applied to a wireless RFIC employing a sliding IF method. Further, the first embodiment can also be applied to Bluetooth (registered trademark) and a microcomputer with Low Energy communication function. Further, the first embodiment can also be applied to a BLE (Bluetooth Low Energy) apparatus having a differential mixer with a sliding IF configuration.

Figure 6A:
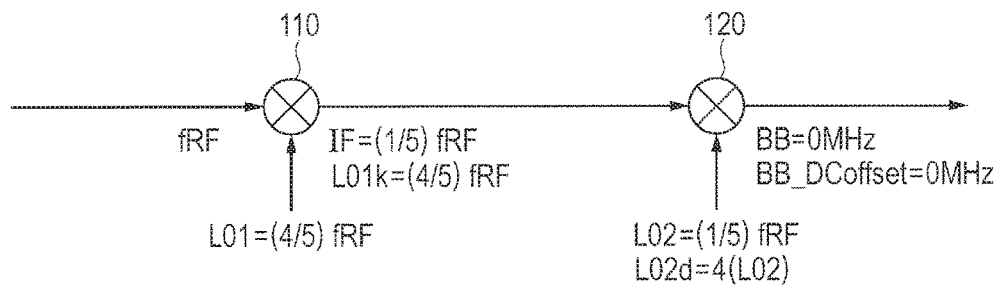
FIG. 6A is a block diagram illustrating operating frequencies of the receiving apparatus according to the first embodiment.

FIG. 6A is a block diagram illustrating operating frequencies of the receiving apparatus according to the first embodiment.

Figure 6B:
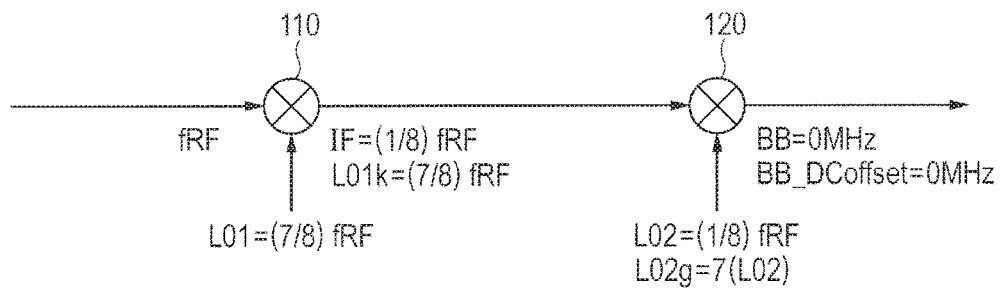
FIG. 6B is a block diagram illustrating operating frequencies of the receiving apparatus according to the first embodiment.

FIG. 6B is a block diagram illustrating operating frequencies of the receiving apparatus according to the first embodiment.

Figure 6C:
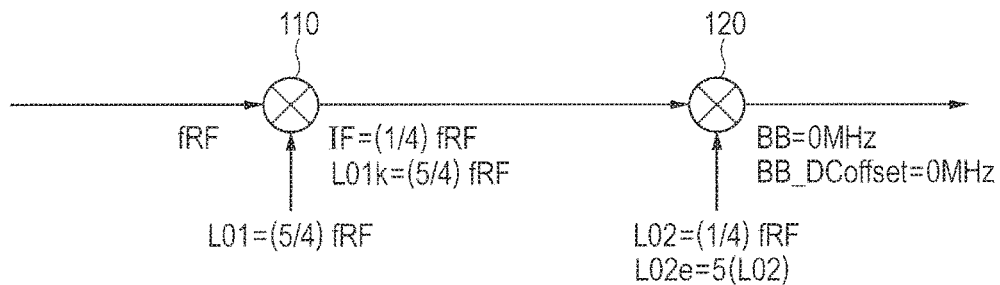
FIG. 6C is a block diagram illustrating operating frequencies of the receiving apparatus according to the first embodiment.

FIG. 6C is a block diagram illustrating operating frequencies of the receiving apparatus according to the first embodiment.

In the first embodiment, as shown in FIG. 6A, a case has been described where the frequency of the local oscillation differential signal LO1 of the 1st MIX (differential mixer 110) is (4/5) times the frequency fRF of the high frequency signal RF and the frequency of the local oscillation differential signal LO2 of the 2nd MIX is (1/5) times the frequency fRF of the high frequency signal RF. The first embodiment is not limited to the above frequency relationship. Different from the above frequency relationship, there are a plurality of combinations of the frequencies (operating frequencies) of the mixers, and the first embodiment can be applied to such a plurality of combinations.

For instance, as another example, as shown in FIG. 6B, the frequency of the local oscillation differential signal LO1 of the 1st MIX is (7/8) times the frequency fRF of the high frequency signal RF and the frequency of the local oscillation differential signal LO2 of the 2nd MIX is (1/8) times the frequency fRF of the high frequency signal RF. In this case, in the 2nd MIX, the leak component LO1k of the local oscillation differential signal LO1 and a seventh harmonic wave LO2g of the local oscillation differential signal LO2 of the 2nd MIX are mixed, so that the BB signal is adversely affected.

As one more example, as shown in FIG. 6C, the frequency of the local oscillation differential signal LO1 of the 1st MIX is (5/4) times the frequency fRF of the high frequency signal RF and the frequency of the local oscillation differential signal LO2 of the 2nd MIX is (1/4) times the frequency fRF of the high frequency signal RF. In this case, in the 2nd MIX, the leak component LO1k of the local oscillation differential signal LO1 and a fifth harmonic wave LO2e of the local oscillation differential signal LO2 of the 2nd MIX are mixed, so that the BB signal is adversely affected.

The first embodiment can be applied not only to the case where the operating frequencies of the mixers are shown in FIG. 6A but also to the cases where the operating frequencies of the mixers are as shown in FIG. 6B and FIG. 6C.

Second Embodiment

Figure 7A:
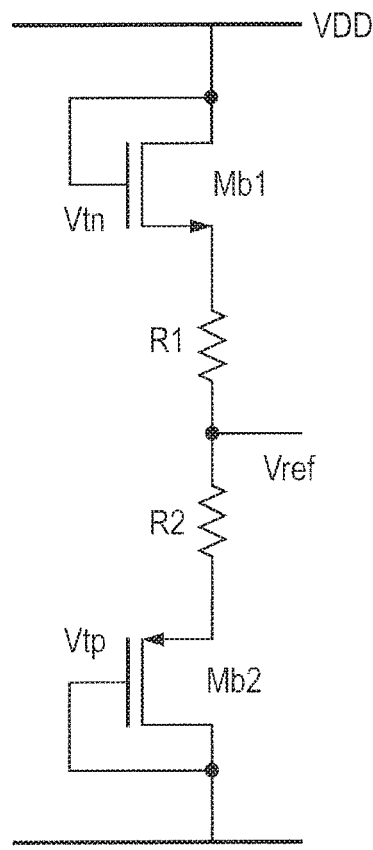
FIG. 7A is a circuit diagram illustrating a bias unit of a differential mixer according to a second embodiment.

FIG. 7A is a circuit diagram illustrating a bias unit of a differential mixer according to a second embodiment.

Figure 7B:
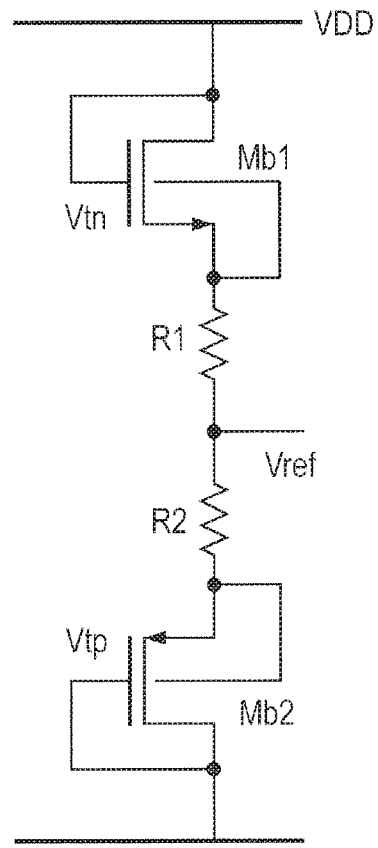
FIG. 7B is a circuit diagram illustrating the bias unit of the differential mixer according to the second embodiment.

FIG. 7B is a circuit diagram illustrating the bias unit of the differential mixer according to the second embodiment.

Figure 7C:
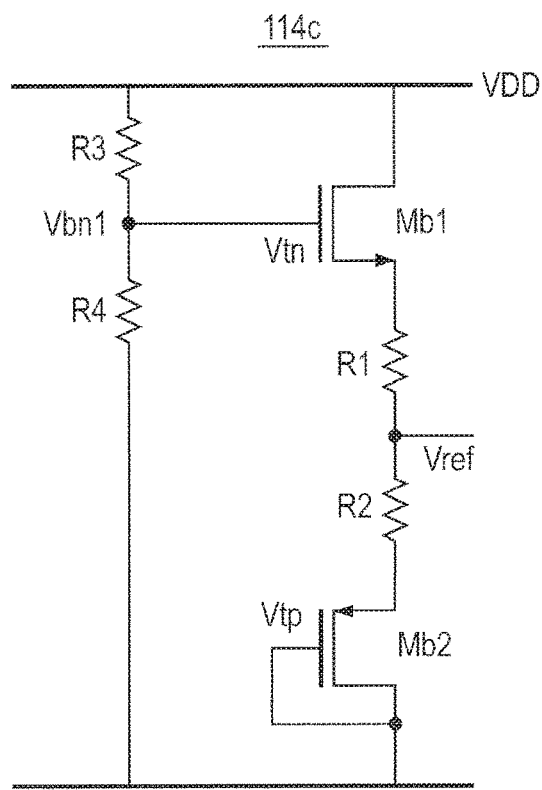
FIG. 7C is a circuit diagram illustrating the bias unit of the differential mixer according to the second embodiment.

FIG. 7C is a circuit diagram illustrating the bias unit of the differential mixer according to the second embodiment.

Figure 7D:
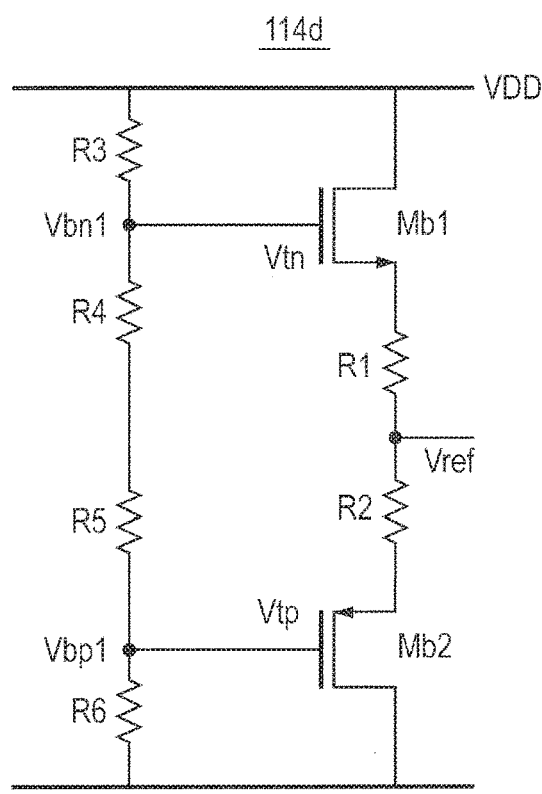
FIG. 7D is a circuit diagram illustrating the bias unit of the differential mixer according to the second embodiment.

FIG. 7D is a circuit diagram illustrating the bias unit of the differential mixer according to the second embodiment.

As shown in FIGS. 7A to 7D, a bias unit of the differential mixer according to the second embodiment is different from the bias unit 114 of the differential mixer according to the first embodiment.

As shown in FIG. 7A, a bias unit 114a according to the second embodiment is different from the bias unit 114 according to the first embodiment in that a first resistance element R1 and a second resistance element R2 are provided in series between the first bias element Mb1 and the second bias element Mb2. The first resistance element R1 and the second resistance element R2 have the same resistance value.

Specifically, in the bias unit 114a, the source S of the first bias element Mb1 and one end of the first resistance element R1 are coupled, the other end of the first resistance element R1 and one end of the second resistance element R2 are coupled, and the other end of the second resistance element R1 and the source S of the second bias element Mb2 are coupled. The bias unit 114a outputs a voltage of the other end of the first resistance element R1 to the common feedback unit 112 as the reference voltage Vref.

Because the first resistance element R1 and the second resistance element R2 are provided, it is possible to reduce current flowing through the first bias element Mb1 and the second bias element Mb2.

As shown in FIG. 7B, in a bias unit 114b, the source S of the first bias element Mb1 and a back gate BG of the first bias element Mb1 may be coupled and the source S of the second bias element Mb2 and a back gate BG of the second bias element Mb2 may be coupled.

A current can be further reduced by lowering a threshold value of a bias element (transistor) by coupling the back gate BG to the source S.

As shown in FIG. 7C, a bias unit 114c may give a bias voltage Vbn1 applied to the first bias element Mb1 from a voltage dividing circuit of the DC voltage VDD.

Specifically, in the bias unit 114c, the gate G of the first bias element Mb1, one end of a third resistance element R3, and one end of a fourth resistance element R4 are coupled, the other end of the third resistance element R3 and the DC voltage VDD are coupled, and the other end of the fourth resistance element R4 and the ground GND are coupled.

It is possible to adjust a central voltage value of the reference voltage Vref by adjusting the bias voltage Vbn1 applied to the first bias element Mb1.

As shown in FIG. 7D, a bias unit 114d may give a bias voltage Vbn1 of the first bias element Mb1 and a bias voltage Vbn2 of the second bias element Mb2 from voltage dividing circuits of the DC voltage VDD.

Specifically, in the bias unit 114d, the gate G of the first bias element Mb1, one end of a third resistance element R3, and one end of a fourth resistance element R4 are coupled, and the other end of the third resistance element R3 and the DC voltage VDD are coupled. The other one end of the fourth resistance element R4, the gate G of the second bias element Mb2, and one end of a fifth resistance element R5 are coupled and the other end of the fifth resistance element R5 and the ground GND are coupled.

It is possible to adjust a central voltage value of the reference voltage Vref by adjusting the bias voltage Vbn1 applied to the first bias element Mb1 and the bias voltage Vbn2 applied to the second bias element Mb2.

The bias voltage may be referred to as a gate bias voltage.

Third Embodiment

Figure 8:
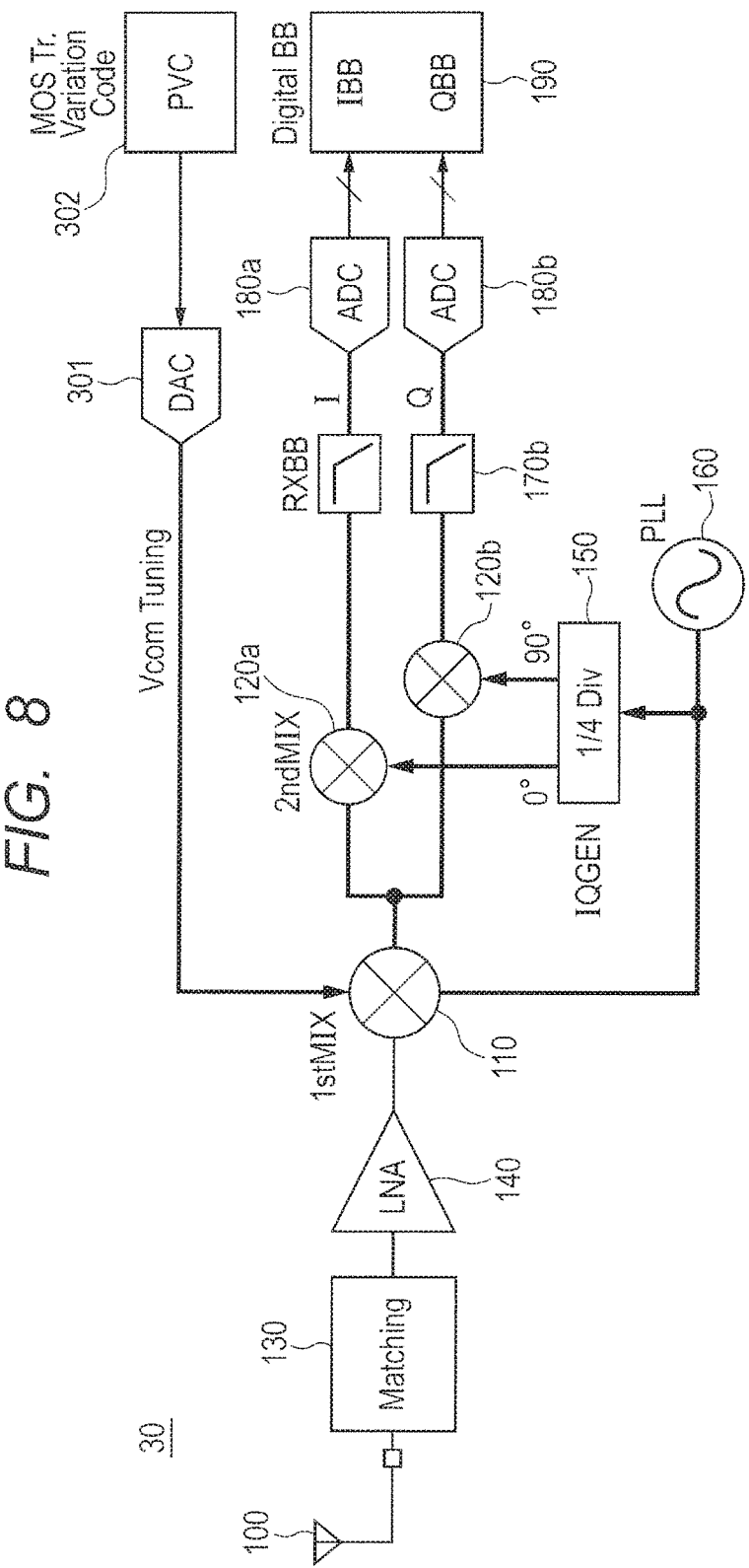
FIG. 8 is a block diagram illustrating a receiving apparatus according to a third embodiment.

FIG. 8 is a block diagram illustrating a receiving apparatus according to a third embodiment.

As shown in FIG. 8, the receiving apparatus 30 according the third embodiment is different from the receiving apparatus 10 according the first embodiment in that the receiving apparatus 30 is provided with a process variation correction unit 302, a DAC 301, and a control unit (not shown in FIG. 8).

The differential mixer 110 according to the third embodiment includes the process variation correction unit 302 and the control unit. For example, the process variation correction unit 302 measures and stores a correspondence relationship between element characteristics of a semiconductor element and the common voltage Vcom as shown in FIG. 4C in advance. The control unit determines the common voltage Vcom where the leak component LOk of the local oscillation differential signal LO is a predetermined value Pth or less at an output end of the intermediate frequency differential signal IF based on element characteristics of a semiconductor element that configures the differential mixer 110 and the correspondence relationship stored in advance. The control unit applies the reference voltage Vref to the common feedback unit 112 so that the determined common voltage Vcom is outputted from an output of the intermediate frequency differential signal IF.

In other words, a degree of variation of characteristics of a semiconductor element (transistor) of NMOS and PMOS is measured, and the reference voltage Vref is automatically adjusted according to the measured characteristics (code) of the semiconductor element.

The process variation correction unit may be referred to as PVC (Process Variation correction). As shown in FIG. 8, the process variation correction unit 302 may be provided outside the differential mixer 110.

While the invention made by the inventors has been specifically described based on the embodiments, it is needless to say that the present invention is not limited to the embodiments described above and may be variously modified without departing from the scope of the invention.

What is claimed is:
1. A differential mixer comprising:
a mixer core unit to which a high frequency signal and a local oscillation differential signal are inputted and which outputs an intermediate frequency differential signal;
a common feedback unit which applies a bias voltage to a signal electrically coupled to the high frequency signal to which a common voltage is fed back from the intermediate frequency differential signal; and a bias unit that applies a reference voltage to the common feedback unit, wherein the common feedback unit generates the bias voltage based on the reference voltage, wherein the bias unit controls the reference voltage so that a leak component of the local oscillation differential signal is a predetermined value or less at an output end of the intermediate frequency differential signal, wherein the bias unit includes a first bias element that comprises a second type semiconductor element where a drain and a gate are electrically coupled to a DC voltage and a second bias element that comprises a first type semiconductor element where a drain and a gate are electrically coupled to a ground and a source is coupled to a source of the first bias element, and wherein the bias unit outputs a voltage of the source of the first bias element to the common feedback unit as the reference voltage.

2. The differential mixer according to claim 1,
wherein, in the bias unit, the source of the first bias element and one end of a first resistance element are coupled, the other end of the first resistance element and one end of a second resistance element are coupled, and the other end of the second resistance element and a source of the second bias element are coupled, and the bias unit outputs a voltage of the other end of the first resistance element to the common feedback unit as the reference voltage.

3. The differential mixer according to claim 2,
wherein the source of the first bias element and a back gate of the first bias element are coupled, and
wherein the source of the second bias element and a back gate of the second bias element are coupled.

4. The differential mixer according to claim 2,
wherein the gate of the first bias element, one end of a third resistance element, and one end of a fourth resistance element are coupled,
wherein the other end of the third resistance element and the DC voltage are coupled, and
wherein the other end of the fourth resistance element and the ground are coupled.

5. The differential mixer according to claim 2,
wherein the gate of the first bias element, one end of a third resistance element, and one end of a fourth resistance element are coupled,
wherein the other end of the third resistance element and the DC voltage are coupled,
wherein the other end of the fourth resistance element, the gate of the second bias element, and one end of a fifth resistance element are coupled, and
wherein the other end of the fifth resistance element and the ground are coupled.

6. The differential mixer according to claim 1,
wherein each of the first type semiconductor element and the second type semiconductor element comprises a field effect transistor.

7. The differential mixer according to claim 1,
wherein in the first type semiconductor element, majority carriers are holes, and
wherein in the second type semiconductor element, majority carriers are electrons.

8. A differential mixer comprising:
a mixer core unit to which a high frequency signal and a local oscillation differential signal are inputted and which outputs an intermediate frequency differential signal;

a common feedback unit which applies a bias voltage to a signal electrically coupled to the high frequency signal and to which a common voltage is fed back from the intermediate frequency differential signal; and a bias unit that applies a reference voltage to the common feedback unit, wherein the common feedback unit generates the bias voltage based on the reference voltage, wherein the bias unit controls the reference voltage so that a leak component of the local oscillation differential signal is a predetermined value or less at an output end of the intermediate frequency differential signal, wherein the mixer core unit includes
a first mixer core that comprises a single balanced mixer formed by a first type semiconductor element, and
a second mixer core that comprises a single balanced mixer formed by a second type semiconductor element, wherein a plus side signal of the intermediate frequency differential signal of the first mixer core and a plus side signal of the intermediate frequency differential signal of the second mixer core are electrically coupled, and wherein a minus side signal of the intermediate frequency differential signal of the first mixer core and a minus side signal of the intermediate frequency differential signal of the second mixer core are electrically coupled.

9. The differential mixer according to claim 8,
wherein the first mixer core includes
a first element that comprises a first type semiconductor element whose source is coupled to a DC voltage,
a third element that comprises the first type semiconductor element whose source is coupled to a drain of the first element, and
a fifth element that comprises the first type semiconductor element whose source is coupled to the drain of the first element, wherein the second mixer core includes
a second element that comprises a second type semiconductor element whose source is coupled to a ground,
a fourth element that comprises the second type semiconductor element whose source is coupled to a drain of the second element and whose drain is coupled to a drain of the third element, and
a sixth element that comprises the second type semiconductor element whose source is coupled to the drain of the second element and whose drain is coupled to a drain of the fifth element, wherein the bias voltage has a first bias voltage and a second bias voltage, wherein the first bias voltage is applied to a gate of the first element, wherein the second bias voltage is applied to a gate of the second element, wherein the common voltage is outputted from the drain of the third element, wherein the high frequency signal is inputted into the gate of the first element and the gate of the second element, wherein a plus side signal of the local oscillation differential signal is inputted into a gate of the fourth element and a gate of the fifth element, wherein a minus side signal of the local oscillation differential signal is inputted into a gate of the third element and a gate of the sixth element, wherein the plus side signal of the intermediate frequency differential signal is outputted from the drain of the third element, and wherein the minus side signal of the intermediate frequency differential signal is outputted from the drain of the fifth element.

10. The differential mixer according to claim 9, wherein each of the first type semiconductor element and the second type semiconductor element comprises a field effect transistor.

11. The differential mixer according to claim 9, wherein in the first type semiconductor element, majority carriers are holes, and
wherein in the second type semiconductor element, majority carriers are electrons.

12. A differential mixer comprising:
a mixer core unit to which a high frequency signal and a local oscillation differential signal are inputted and which outputs an intermediate frequency differential signal;
a common feedback unit which applies a bias voltage to a signal electrically coupled to the high frequency signal and to which a common voltage is fed back from the intermediate frequency differential signal;
a process variation correction unit that measures and stores a correspondence relationship between element characteristics of a semiconductor element and the common voltage in advance, and
a control unit that determines the common voltage where a leak component of the local oscillation differential signal is a predetermined value or less at an output end of the intermediate frequency differential signal based on the element characteristics of the semiconductor element including the control unit and the stored correspondence relationship, and applies a reference voltage to the common feedback unit so that the determined common voltage is outputted from an output of the intermediate frequency differential signal.

* * * * *